United States Patent
Lo

(10) Patent No.: US 8,536,593 B2
(45) Date of Patent: Sep. 17, 2013

(54) LED DEVICE HAVING TWO LED DIES SEPARATED BY A DAM

(75) Inventor: Hsing-Fen Lo, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 43 days.

(21) Appl. No.: 13/430,707

(22) Filed: Mar. 27, 2012

(65) Prior Publication Data

US 2013/0062636 A1    Mar. 14, 2013

(30) Foreign Application Priority Data

Sep. 13, 2011   (CN) .......................... 2011 1 0269169

(51) Int. Cl.
*H01L 29/20*    (2006.01)
*H01L 33/00*    (2010.01)

(52) U.S. Cl.
USPC .......................................................... 257/89

(58) Field of Classification Search
USPC ............. 257/13, 79–103, 116, 117, 432–437, 257/457, 459, 749, 918, E33.056–E33.059, 257/E25.032, 186, E31.005, E51.018–E51.022, 257/E33.001–E33.077, E33.054, E25.028, 257/E31.058, E31.06; 438/22–47, 69, 493, 438/503, 507, 956
See application file for complete search history.

(56) References Cited

U.S. PATENT DOCUMENTS

| | | | |
|---|---|---|---|
| 7,714,347 B2 * | 5/2010 | Chen et al. ...................... | 257/99 |
| 8,026,533 B2 * | 9/2011 | Noichi ............................. | 257/99 |
| D658,606 S * | 5/2012 | Shimizu et al. ............... | D13/180 |
| 8,324,654 B2 * | 12/2012 | An et al. .......................... | 257/99 |
| 2007/0096114 A1 * | 5/2007 | Aoki et al. ...................... | 257/79 |
| 2008/0037252 A1 * | 2/2008 | Nii et al. ........................ | 362/267 |
| 2010/0090231 A1 * | 4/2010 | Jung et al. ...................... | 257/89 |
| 2010/0133576 A1 * | 6/2010 | Chen et al. ..................... | 257/98 |
| 2011/0215349 A1 * | 9/2011 | An et al. ......................... | 257/89 |
| 2011/0291135 A1 * | 12/2011 | Hsieh et al. .................... | 257/98 |
| 2012/0161180 A1 * | 6/2012 | Komatsu et al. ............... | 257/98 |
| 2013/0049025 A1 * | 2/2013 | Chang et al. ................... | 257/88 |

* cited by examiner

*Primary Examiner* — Dao H Nguyen
*Assistant Examiner* — Tram H Nguyen
(74) *Attorney, Agent, or Firm* — Altis & Wispro Law Group, Inc.

(57) ABSTRACT

An LED device comprises a substrate, a circuit, two LED dies, a dam and a reflector. The dam divides the substrate into a first area and a second area, wherein one of the two LED dies is disposed on the first area and the other is disposed on the second area. The dam insulates radiant lights emitted from the two LED dies, whereby interference between the radiant lights can be prevented. Four separate electrodes are provided on the substrate, wherein one LED die is connected to two electrodes and the other LED die is electrically connected to the other two electrodes.

20 Claims, 4 Drawing Sheets

LED DEVICE HAVING TWO LED DIES SEPARATED BY A DAM

TECHNICAL FIELD

The disclosure relates to semiconductor light emitting devices, and more particularly to a light emitting diode package device with multiple light sources.

DESCRIPTION OF THE RELATED ART

Light emitting diodes (LEDs) have low power consumption, high efficiency, quick reaction time, long lifetime, and the absence of toxic elements such as mercury during manufacturing. Traditional light sources such as fluorescent lamps and incandescent lamps are gradually being replaced by LED light sources due to their advantages. Many LED package devices may contain an LED die for emitting initial light and at least one luminescent conversion element in the vicinity of the LED die. During operation, an operating current is directed into the LED die to produce the initial light out of the LED die. The luminescent conversion element is able to absorb the portion of the initial light emitted, and then transform the initial light into excited light at different spectrums. Thereafter, the other initial light and the excited light are mixed to generate emitting light with multiple wavelengths out of the LED package device. For rendering various colors, a plurality of LED package devices or a plurality of LED dies may be assembled in one module or one package device. However, more devices or more LED dies used may result higher cost. Moreover, lights emitted from different LED dies may interfere with each other to reduce an intensity of the emitted light out of the LED package device. Hence, a new designed LED device that overcomes aforementioned deficiencies is required.

DETAILED DESCRIPTION

Exemplary embodiments of the disclosure will be described with reference to the accompanying drawings.

Figure 1:
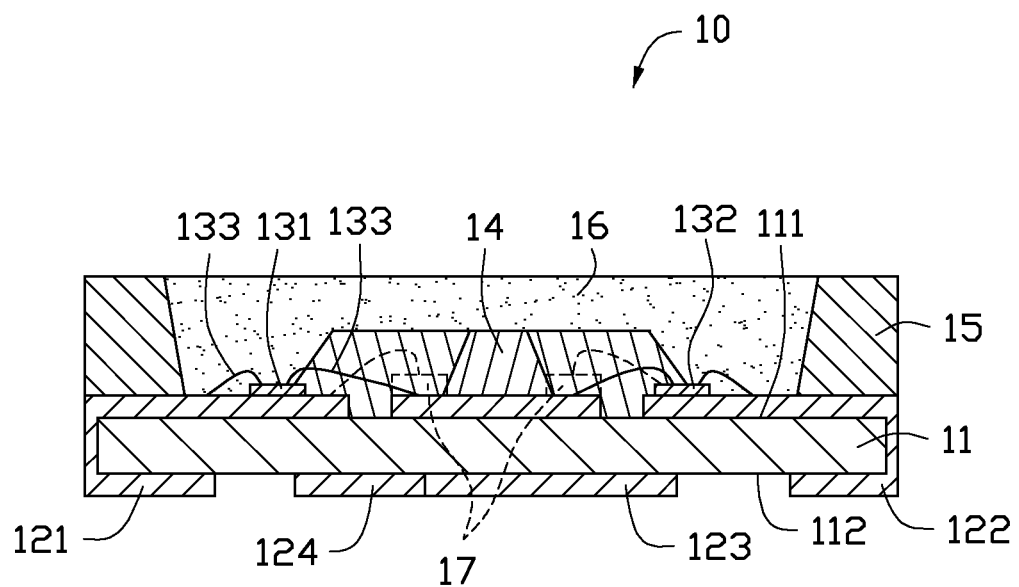
FIG. 1 is a cross section of an LED device in accordance with a first embodiment of the disclosure.
Figure 2:
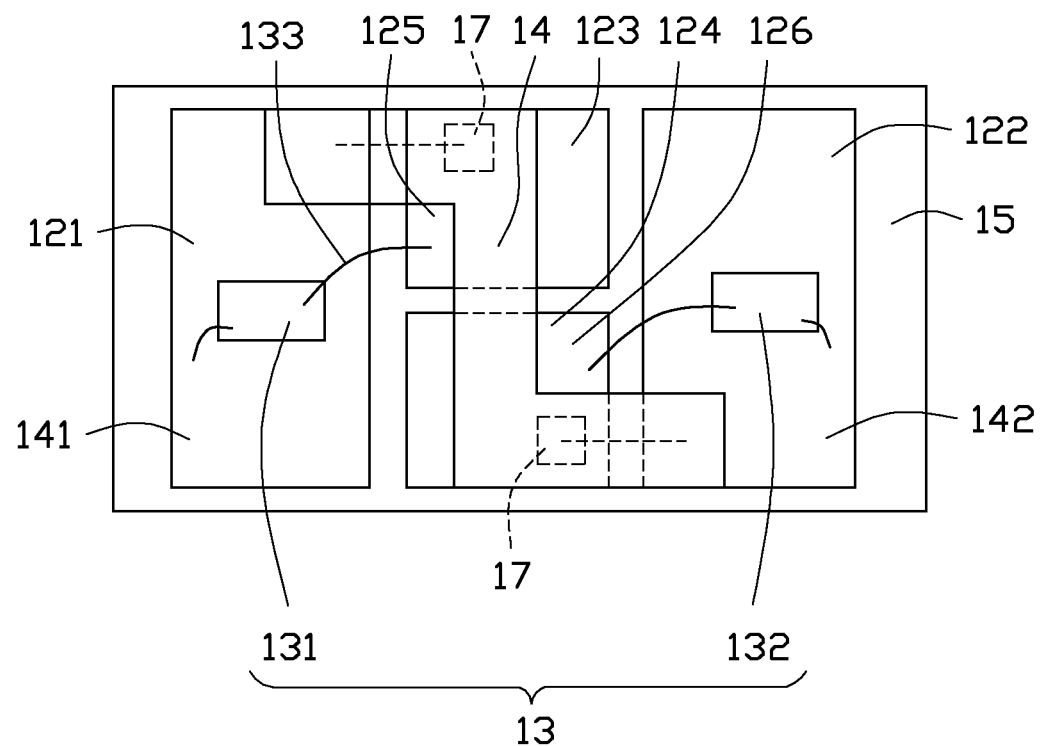
FIG. 2 is a top view of the LED device of FIG. 1.
Figure 3:
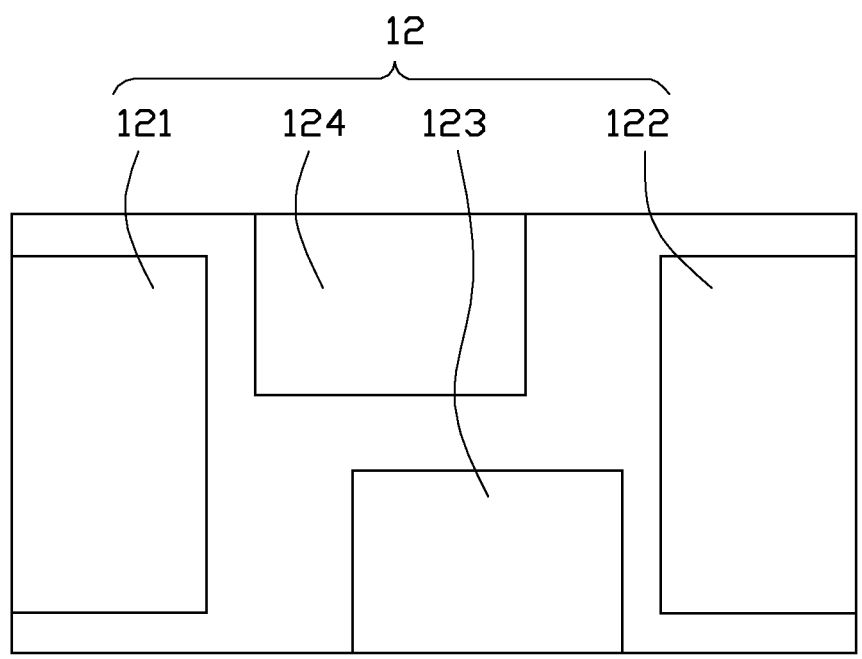
FIG. 3 is a bottom view of the LED device of FIG. 1.

Referring to FIG. 1 to FIG. 3, the disclosure provides a first embodiment of an LED device 10 comprising a substrate 11, a circuit 12, two LED dies 13, a dam 14, a reflector 15, an encapsulation layer 16, and two voltage stabilizers 17.

The substrate 11 comprises a top surface 111 and a bottom surface 112 opposite to each other, as shown in FIG. 1. The two LED dies 13, the dam 14, the reflector 15, the encapsulation layer 16 and the two voltage stabilizers 17 are all disposed on the top surface 111 of the substrate 11. The substrate 11 is electrically-insulative and can be made by plastic, polymer or silicon.

The circuit 12 extends from the top surface 111 of the substrate 11 to the bottom surface 112, as shown in FIG. 3, and is composed of a first electrode 121, a second electrode 122, a third electrode 123 and a fourth electrode 124, wherein these four electrodes 121, 122, 123, 124 are separated and electrically insulated from each other. In the embodiment, the first and the second electrodes 121, 122 are located in the vicinity of two opposite ends of the substrate 11. The third and the fourth electrodes 123, 124 are located in a middle of the substrate 11 between the first and the second electrodes 121, 122.

The two LED dies 13 are disposed on the top surface 111 of the substrate 11 and electrically connect to the circuit 12. In the embodiment, the two LED dies 13 are composed of a first LED die 131 and a second LED die 132, wherein the first LED die 131 is disposed on the first electrode 121 and electrically connects to the first and the third electrodes 121, 123 by conductive wires 133. The second LED die 132 is disposed on the second electrode 122 and electrically connects to the second and the fourth electrodes 122, 124 by conductive wires 133. The first LED die 131 and the second LED die 132 are capable of emitting lights during operation. Spectrums of the lights emitted from the first LED die 131 and the second LED die 132 can be equal or different. In this embodiment, the spectrums are different, wherein light generated by the first LED die 131 is blue and light generated by the second LED die 132 is red.

The dam 14 is located on the top surface 111 of the substrate 11 between the first and the second LED dies 131, 132, wherein the dam 14 covers a portion of the circuit 12 and separate the first LED die 131 from the second LED die 132. In the embodiment, the dam 14 crosses the third and the fourth electrodes 123, 124 from the first electrode 121 to the second electrode 122. The dam 14 divides the top surface 111 into a first area 141 and a second area 142. In the embodiment, as shown in FIG. 2, the dam 14 is a generally Z-shaped structure on the substrate 11. The first LED die 131, the first electrode 121 and a first connective portion 125 of the third electrode 123 are defined within the first area 141. The first LED die 131 electrically connects to the first electrode 121 and the first connective portion 125 by the conductive wires 133. Moreover, the second LED die 132, the second electrode 122 and a second connective portion 126 of the fourth electrode 124 are defined within the second area 142. The second LED die 132 electrically connects to the second electrode 122 and the second connective portion 126 by the conductive wires 133. Accordingly, it is not necessary for the conductive wires 133 to cross over the dam 14, whereby a thickness of the LED device 10 can be reduced. Furthermore, radiant lights emitted from the first and the second LED dies 131, 132 are isolated by the dam 14, whereby interference between the radiant lights can be prevented. In the embodiment, the dam 14 is reflective and the two lateral sides of the dam 14 which respectively face the first and the second LED dies 131, 132 are oblique. Therefore, the dam 14 not only can isolate the radiant lights from the two LED dies 13, but it also can reflect the radiant lights to a determined direction.

The reflector 15 is located on the top surface 111 of the substrate 11 around the two LED dies 13 and the dam 14. The reflector 15 can be made by plastic, polymer or silicon; alternatively, the substrate 11, the dam 14 and the reflector 15 can be integrated. In the embodiment, two ends of the dam 14 respectively connect to the reflector 15, as shown in FIG. 2, wherein a height of the dam 14 is smaller than that of the reflector 15. The reflector 15 is made of reflective material to direct the radiant lights emitted from the two LED dies 13 or reflected by the dam 14 to a determined direction out of the LED device 10.

The encapsulation layer 16 is located inside the reflector 15, and covers the two LED dies 13 and the dam 14. The encapsulation layer 16 is made of transparent material, which can be selected from epoxy, silicone or a mixture thereof. In one embodiment, the encapsulation layer 16 comprises at least one luminescent conversion element such as YAG (yttrium aluminum garnet) phosphor, TAG (terbium aluminum garnet) phosphor or silicate phosphor.

The two voltage stabilizers 17 are respectively located on the third and fourth electrodes 123, 124. The voltage stabilizer 17 on the third electrode 123 is electrically connected to the first and third electrodes 121, 123. The voltage stabilizer 17 on the fourth electrode 124 is electrically connected to the second and fourth electrodes 122, 124. In this embodiment, the two voltage stabilizers 17 are Zener diodes. Moreover, the two voltage stabilizers 17 make reverse-parallel connection to the first and the second LED dies 131, 132 to prevent the two LED dies 13 from damage by an impulse or electrostatic. In the embodiment, the two voltage stabilizers 17 are encapsulated by the dam 14, which is not transparent, whereby the two voltage stabilizers 17 would not absorb the radiant lights emitted from the two LED dies 13.

Figure 4:
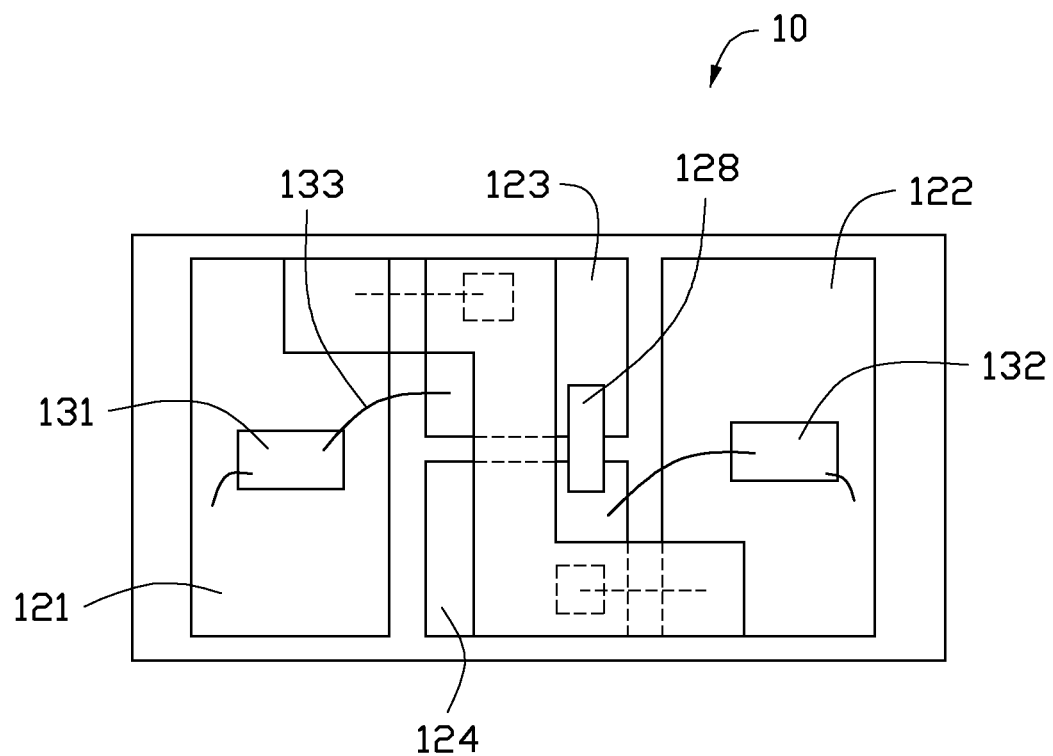
FIG. 4 is a top view of an LED device in accordance with a second embodiment of the disclosure.

Referring to FIG. 4, the disclosure also provides a second embodiment of an LED device 20 which is similar to the first embodiment; only the difference is that the third electrode 123 electrically connects to the fourth electrode 124 by a connector 128. In the second embodiment of the LED device 20, the first and the second electrodes 121, 122 comprise an input port (positive) and an output port (negative), whereby the first LED die 131 and the second LED die 132 are electrically connected in series. Alternatively, the first electrode 121 and the second electrode 122 are two input ports (positives), and the third electrode 123 and the fourth electrode 124 are two output ports (negatives), whereby the first LED die 131 and the second LED die 132 are electrically connected in parallel. In the first embodiment of FIGS. 1-3 which does not have the connector 128, the first electrode 121 and the second electrode 122 are two input ports (positives), and the third electrode 123 and the fourth electrode 124 are two output ports (negatives), whereby the first LED die 131 and the second LED die 132 are electrically connected in parallel.

According to the disclosure, the first and the second LED dies 131, 132 are isolated by the dam 14, thereby radiant lights emitted from the two LED dies 13 will not interfere with each other. Moreover, the circuit 12 allows the first and the second LED dies 131, 132 to be electrically connected in parallel or in series. Furthermore, the conductive wires 133 do not cross over the dam 14, whereby a thickness of the LED devices 10 or 20 can be reduced.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An LED (light emitting diode) device, comprising:
   a substrate, comprising a top surface and a bottom surface opposite to each other;
   a circuit, located on the top surface of the substrate and extending to the bottom surface, comprising a first electrode, a second electrode, a third electrode and a fourth electrode separated to each other;
   a dam, located on the top surface of the substrate and dividing the top surface into a first area and a second area, wherein the dam crosses the third and the fourth electrodes from the first electrode to the second electrode;
   a first LED die, disposed on the first area and electrically connecting to the first and the third electrodes; and
   a second LED die, disposed on the second area and electrically connecting to the second and the fourth electrodes.

2. The LED device as claimed in claim 1, wherein the first die electrically connects to the first and third electrodes by conductive wires, and the second die electrically connects to the second and fourth electrodes by conductive wires.

3. The LED device as claimed in claim 1, wherein the dam is a Z-shaped structure on the substrate.

4. The LED device as claimed in claim 1, wherein the first and the second electrodes are located in the vicinity of opposite two ends of the substrate, and the third and the fourth electrodes are located in a middle of the substrate between the first and the second electrodes.

5. The LED device as claimed in claim 1, wherein a reflector is located on the top surface of the substrate around the dam, the first and the second LED die, and an encapsulation layer is located inside the reflector, and covers the dam, the first and the second LED dies.

6. The LED device as claimed in claim 5, wherein a height of the dam is smaller than that of the reflector.

7. The LED device as claimed in claim 1, wherein the third electrode electrically connects to the fourth electrode by a connector.

8. The LED device as claimed in claim 7, wherein the first electrode is a positive and the second electrode is a negative and the first LED die and the second LED die are electrically connected together in series.

9. The LED device as claimed in claim 7, wherein the first and second electrodes are positives and the third and fourth electrode are negatives and the first LED die and the second LED die are electrically connected in parallel.

10. The LED device as claim in claim 1, wherein the first and second LED dies generate light rays of different spectrums.

11. The LED device as claimed in claim 1, wherein the first electrode and the second electrode are positives, and the third electrode and the fourth electrode are negatives, and wherein the first LED die and the second LED die are electrically connected together in parallel.

12. The LED device as claimed in claim 1, wherein two voltage stabilizers are located inside the dam and make reverse-parallel connections to the first and the second LED dies, respectively, and wherein one of the voltage stabilizers is electrically connected to the first and third electrodes and the other one of the voltage stabilizers is electrically connected to the second and fourth electrodes.

13. The LED device as claimed in claim 12, wherein the two voltage stabilizers are Zener diodes.

14. The LED device as claimed in claim 1, wherein the substrate, the dam and the reflector are integrated.

15. An LED device, comprising:
   a substrate, comprising a top surface and a bottom surface opposite to each other;
   a circuit, located on the top surface of the substrate and extending to the bottom surface, comprising a first electrode, a second electrode, a third electrode and a fourth electrode separated from each other;
   a dam, located on the top surface of the substrate and dividing the top surface into a first area and a second area, wherein the dam crosses the third and the fourth electrodes from the first electrode to the second electrode;
   two LED dies, comprising a first LED die on the first area and a second LED die on the second area, electrically connecting to the circuit by conductive wires, wherein the first LED die electrically connects with the first and third electrodes and the second LED die electrically connects with the second and fourth electrodes;

a reflector, located on the top surface of the substrate around the two LED dies and the dam; and an encapsulation layer, located inside the reflector, and covering the two LED dies and the dam.

16. The LED device as claimed in claim 15, wherein the first and the second electrodes are located in the vicinity of opposite two ends of the substrate, and the third and the fourth electrodes are located in a middle of the substrate between the first and the second electrodes.

17. The LED device as claimed in claim 15, wherein a height of the dam is smaller than that of the reflector.

18. The LED device as claimed in claim 15, wherein the dam is a Z-shaped structure on the substrate.

19. The LED device as claimed in claim 15, wherein the third electrode electrically connects to the fourth electrode by a connector, and the first and second LED dies are electrically connected together in series.

20. The LED device as claimed in claim 15, wherein two voltage stabilizers are located inside the dam and make reverse-parallel connections to the first and the second LED dies, respectively, and wherein one of the voltage stabilizers is electrically connected to the first and third electrodes and the other one of the voltage stabilizers is electrically connected to the second and fourth electrodes.

* * * * *